United States Patent
Suzuki

[19]

[11] Patent Number: 6,066,520
[45] Date of Patent: May 23, 2000

[54] METHOD OF MANUFACTURING A BICMOS SEMICONDUCTOR DEVICE

[75] Inventor: Hisamitsu Suzuki, Tokyo, Japan

[73] Assignee: NEC Corporation, Tokyo, Japan

[21] Appl. No.: 09/184,235

[22] Filed: Nov. 2, 1998

[30] Foreign Application Priority Data

Nov. 6, 1997 [JP] Japan ..................................... 9-304591

[51] Int. Cl.[7] .............................................. H01L 21/8238
[52] U.S. Cl. ........................................... 438/202; 438/234
[58] Field of Search .................................. 438/202, 203, 438/204, 205, 234, 236, 322

[56] References Cited

U.S. PATENT DOCUMENTS 5,547,893 8/1996 Sung ........................................ 438/202
5,970,333 10/1999 Girs et al. ................................ 438/207

FOREIGN PATENT DOCUMENTS 9-171657  1/1999  Japan .

Primary Examiner—Tuan H. Nguyen
Attorney, Agent, or Firm—Young & Thompson

[57] ABSTRACT

A method of making a BiCMOS semiconductor device in which different polysilicon layers are used to form the gate electrodes of the CMOS devices and an emitter leading electrode for the bipolar device. A first polysilicon layer forms the lower portion of the gate electrodes of the CMOS devices, while a second highly doped polysilicon layer forms a center portion of emitter leading electrode of the bipolar device.

20 Claims, 10 Drawing Sheets ered to as BiCMOS).

METHOD OF MANUFACTURING A BICMOS SEMICONDUCTOR DEVICE

FIELD OF THE INVENTION

The present invention relates to a semiconductor device manufacturing method, and particularly to a method of making a semiconductor device having a bipolar transistor and a complementary field effect transistor (hereafter, referred to as BiCMOS).

BACKGROUND OF THE INVENTION

In the art of semiconductor integrated circuit devices capable of the high-speed operation and high driving capacity of a bipolar transistor and the small power consumption of a CMOS, it is conventionally known to form the bipolar transistor and the CMOS on the same chip substrate in a BiCMOS structures.

However, the need for yet higher speeds and for yet smaller power consumption and size are not yet completely satisfied. Accordingly, the inventor of the present invention has disclosed an improvement to the conventional methods in Japanese Patent Application No. 09-171657 which is related to present invention but which is not believed to be prior art.

This related invention will be explained with reference to FIGS. 1A to 1H.

First, in FIG. 1A, an element isolation oxide film 107 and a first oxide film 133 are formed in a P-type silicon substrate 101 by the LOCOS (Local Oxidation of Silicon) isolation method and the STI (Shallow Trench Isolation) method which are generally known.

Then, as shown in FIG. 1B, a first P-type well region 102 is formed in the NMOS forming region by implanting, for example, boron ions at an energy of 350 keV and a concentration of $5 \times 10^{13}$ cm$^{-2}$. First N-type well regions 106 are formed in the PMOS forming region and the collector region of a bipolar transistor by implanting phosphorus ions at an energy of 700 keV and a concentration of $5 \times 10^{13}$ cm$^{-2}$.

As shown in FIG. 1C, after removing the first oxidation film 133, a first insulating film 108 having a thickness of 5 to 10 nm is formed on the surface of substrate 101. The first insulating film 108 comprises a gate oxide film. Then, for example, boron or BF$_2$ ions are implanted at an energy of 10 to 50 keV and a concentration of $1 \times 10^{13}$ to $5 \times 10^{14}$ cm$^{-2}$ to form a P-type base region 109. An emitter contact 110 and a collector contact 126 are opened, and then first conductive polysilicon 112 is grown to a thickness of 150 to 400 nm.

Significantly, as shown in FIG. 1D, gate electrodes 113, 141 and an emitter leading electrode 114 are formed from first polysilicon 112 by anisotropic etching using a mask made of photoresist or the like. An etch using the same mask and the first insulating film 108 as masks forms a collector trench 124, and the mask is thereafter removed. These types of etching can be continuously performed under the same condition or performed in a plurality of steps by dividing the etching into several stages.

Next, as shown in FIG. 1E, an N-type LDD (Lightly Doped Drain) layer 120 and a P-type LDD layer 121 are formed. Side walls 119 are then formed on the walls of the gate electrodes 113, 141, emitter leading electrode 114, and collector trench 124 respectively by anisotropic etching.

Then, in FIG. 1F, a thin oxide film 132 having a thickness of 5 to 20 nm is formed. An N$^+$-type diffusion layer 128 at the bottom of the collector trench 124 and N$^+$-type source-drain 122 of the NMOS device are formed by implanting ions of an impurity such as phosphorus or arsenic. This implantion of N-type ions also makes gate electrode 113 of the NMOS device into an N-type gate electrode. P$^+$-type source-drain 123 and P$^+$-type graft base 116 of the PMOS device are formed by implanting ions of an impurity such as boron or BF$_2$. This implantation of P-type ions also makes gate electrode 141 of the PMOS device into a P-type gate electrode.

Note that an impurity is introduced into the emitter leading electrode 114 by implanting ions of an impurity such as phosphorus or arsenic when forming the N$^+$-type source-drain 122 or by introducing the impurity by adding another process step.

With reference to FIG. 1G, surfaces of the gate electrodes 113, 141, emitter leading electrode 114, N$^+$-type diffusion layer 128 at the bottom of the collector trench 124, N$^+$-type source-drains 122, P$^+$-type source-drain 123, and P$^+$-type graft base 116 are transformed into silicide through a conventional method by using a metal such as titanium, cobalt, or nickel to form a silicide layer 125.

In FIG. 1H, a layer insulating film 127 formed with, for example, a 5 nm-thick oxide film (TEOS-SiO$_2$ film) and a 800 nm-thick BPSG (boron-phosphorus-silicate-glass) is grown. The film 127 is subjected to RTA (rapid thermal annealing) at 1,050° C. for 5 to 15 sec or oven annealing at 900° C. for 20 to 30 min to form an emitter diffusion layer 117. Thereafter, a contact is opened to form a contact plug 129 through a barrier metal (not illustrated) and then, metallic wiring 130 is formed.

However, the first problem with this process is that the mask made of photoresist or the like and the first insulating film 108 are respectively masked and etched when forming the collector trench as shown in FIG. 1D. This reduces the thickness of the first insulating film 108 and reduces its effectiveness as a mask.

There is also a second problem with this process. When a wiring layer is shared by a gate electrode and an emitter leading electrode in a BiCMOS fabrication method, there is no problem if a P-channel MOS gate electrode and an N-channel MOS gate electrode are both formed from N type polysilicon. However, when forming a P-type gate electrode, referred to as a PN gate, on a P-channel MOS and an N-type gate electrode on an N-channel MOS, and when using an emitter electrode and a wiring layer in common, it is necessary to implant P-type and N-type impurities separately from each other in the polysilicon constituting the gate electrode and the emitter leading electrode. This increases the number of man-hours and decreases the number of degrees of freedom in the fabrication process.

SUMMARY OF THE INVENTION

Accordingly, it is an object of the present invention to provide a novel method of making a BiCMOS device that avoids these problems of the related art.

It is a further object of the present invention to present an improved method of manufacturing a BiCMOS semiconductor device which increases the process margin for forming an emitter leading electrode and collector trench of a bipolar transistor.

It is another object of the present invention to provide a novel method of making a semiconductor device in which different polysilicon layers are used to make the gate electrodes of MOS devices and the emitter electrode of a bipolar device.

These and other objects of the present invention will be apparent to those of skill in the art from the appended claims when read in light of the specification and accompanying figures.

DESCRIPTION OF THE PREFERRED EMBODIMENTS

The present invention is directed to a method of making a BiCMOS semiconductor device in which different polysilicon layers are used to form the gate electrodes of the CMOS devices and an emitter leading electrode for the bipolar device. A first polysilicon layer forms the lower portion of the gate electrodes of the CMOS devices, while the second highly doped polysilicon layer forms a center portion of emitter leading electrode of the bipolar device.

The first embodiment of the present invention is described below with reference to FIGS. 2A–2K.

Figure 1A:
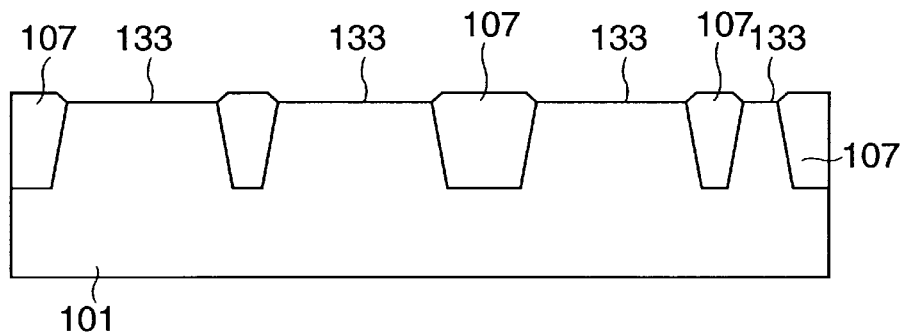
FIGS. 1A to 1H are sectional views for explaining the related art.
Figure 1B:
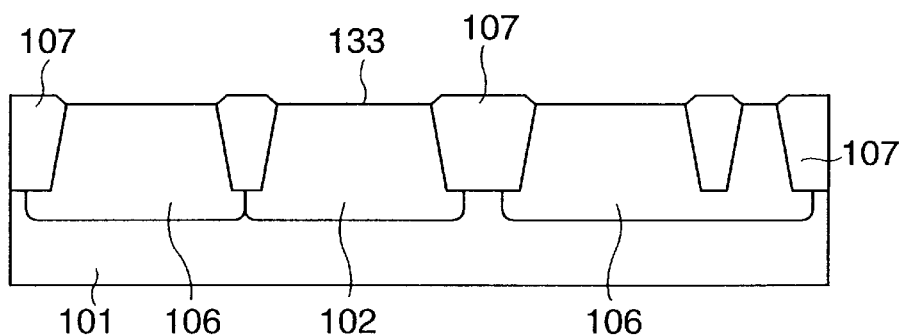
Figure 1C:
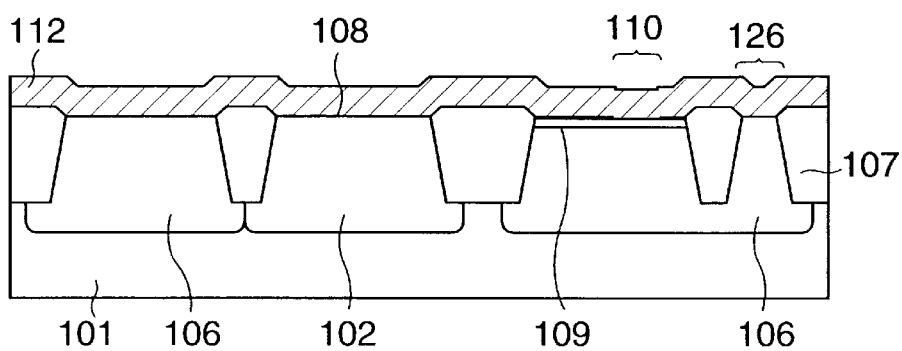
Figure 1D:
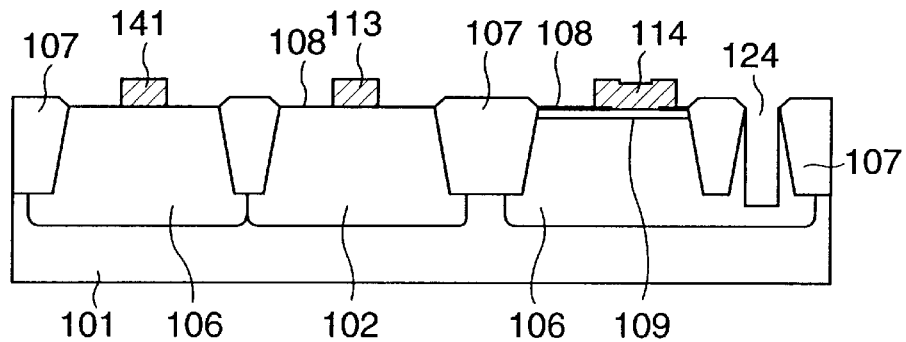
Figure 1E:
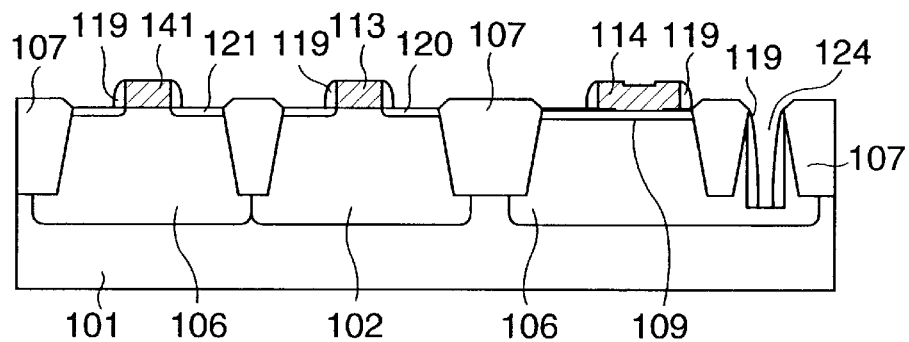
Figure 1F:
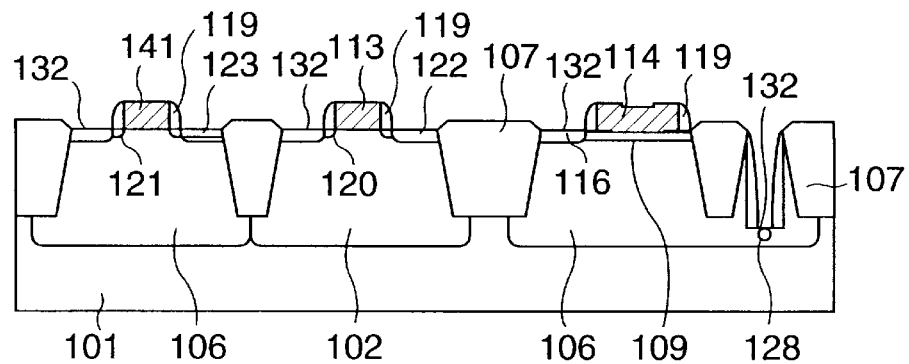
Figure 1G:
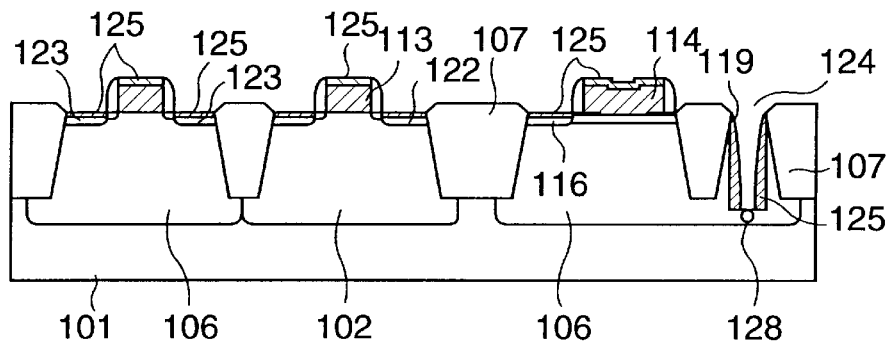
Figure 1H:
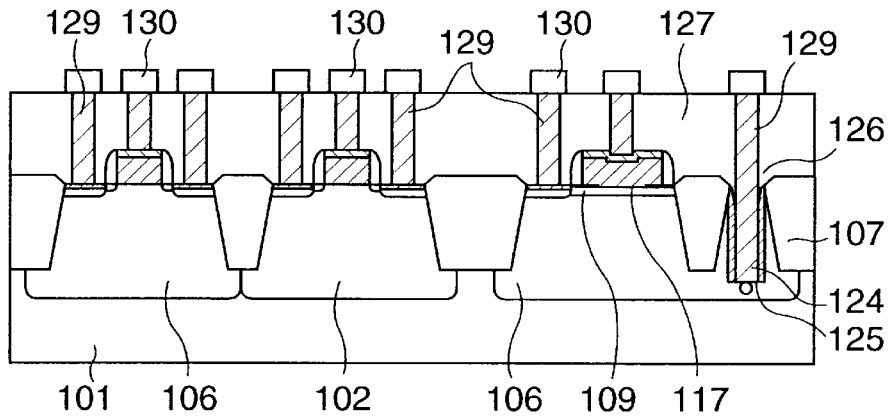
Figure 2A:
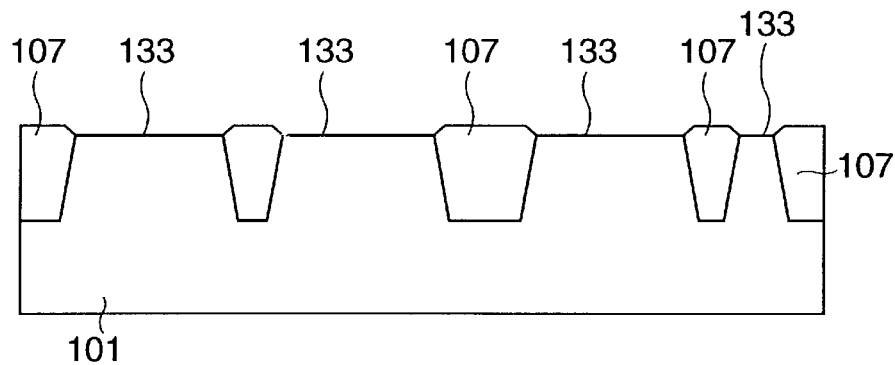
FIGS. 2A to 2K are sectional views for explaining the first embodiment of the present invention.

As in the related art and as shown in FIG. 2A, an element isolation oxide film 107 and a first oxide film 133 are formed in a P-type silicon substrate 101 by the LOCOS isolation method and STI method. Then, in FIG. 2B, a first P-type well region 102 is formed in the NMOS forming region by implanting, for example, boron ions at an energy of 350 keV and a concentration of $5 \times 10^{13}$ cm$^{-2}$. First N-type well regions 106 are formed in the PMOS forming region and the collector region of a bipolar transistor by implanting phosphorus ions at an energy of 700 keV and a concentration of $5 \times 10^{13}$ cm$^{-2}$. Further, as shown in FIG. 2C, after removing the first oxide film 133, a first insulation film 108 having a thickness of 5 to 10 nm is formed on the surface of substrate 101. The first insulating film 108 comprises a gate oxide film. Then, for example, boron or BF$_2$ ions are implanted at an energy of 10 to 50 keV and a concentration of $1 \times 10^{13}$ to $5 \times 10^{14}$ cm$^{-2}$ to form a P-type base region 109.

In contrast to the related art, a second polysilicon 103 having a thickness of 50 to 200 nm is grown on first insulating film 108. Then a second insulating film 104 made of a 5 to 100 nm thick silicon oxide or silicon nitride film is formed thereon. The second insulating film 104, second polysilicon 103, and first insulating film 108 are removed by anisotropic etching by using a first mask 105 made of photoresist or the like to open emitter contact 110 and a collector contact 126.

Figure 2B:
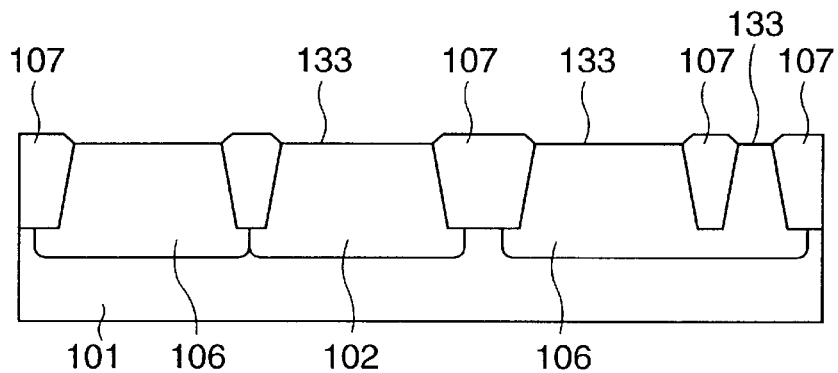
Figure 2C:
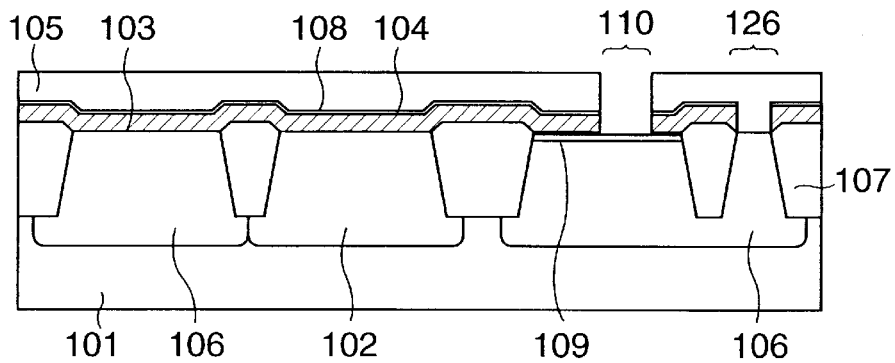
Figure 2D:
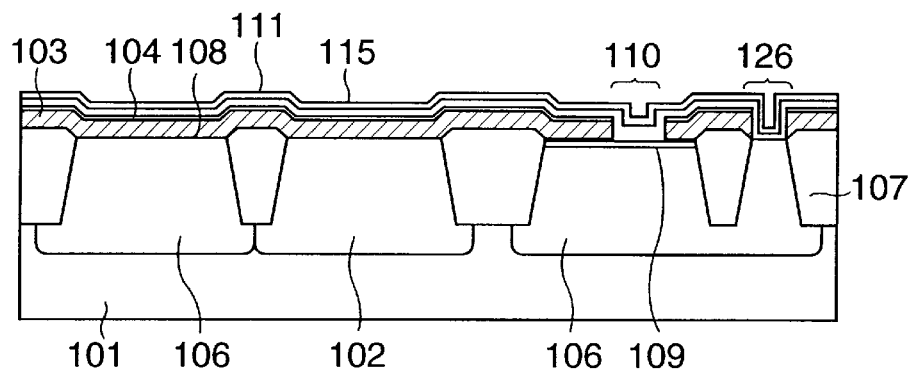

Then, as shown in FIG. 2D, the first mask 105 is removed and third polysilicon 111 is formed with a thickness of 50 to 200 nm and a third insulating film 115 of a silicon oxide film or silicon nitride film is formed thereon with a thickness of 50 to 100 nm.

In this case, the third polysilicon 111 is implanted with phosphorus or arsenic ions so that the peak concentration of the impurity in the third polysilicon 111 becomes $1 \times 10^{19}$ to $1 \times 10^{21}$ cm$^{-3}$.

Figure 2E:
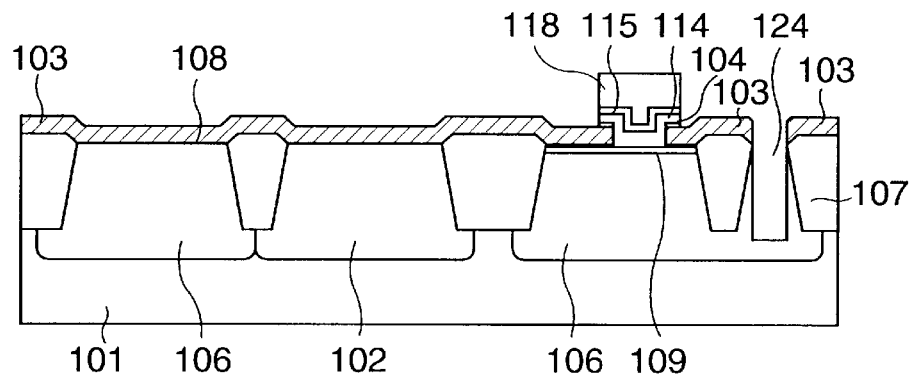

Then, in FIG. 2E, an emitter leading electrode 114 is formed by anisotropic etching by using a second mask 118 made of photoresist or the like. A collector trench 124 is formed by etching by using the same mask and the second insulating film 104 as masks to form the collector trench and then, the second insulating film 104 is removed. It is possible to continuously perform these etches or to perform the etches in a plurality of steps. The bottom of the collector trench 124 extends into N-type well region 106 to reach a collector region having a locally highest impurity concentration.

Figure 2F:
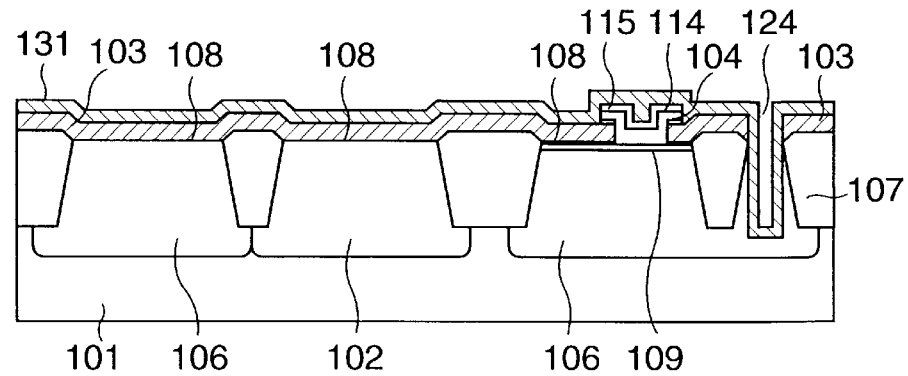

In FIG. 2F, the second mask 118 on emitter leading electrode 114 is removed and a fourth polysilicon 131 is formed with a thickness of 50 to 300 nm.

Figure 2G:
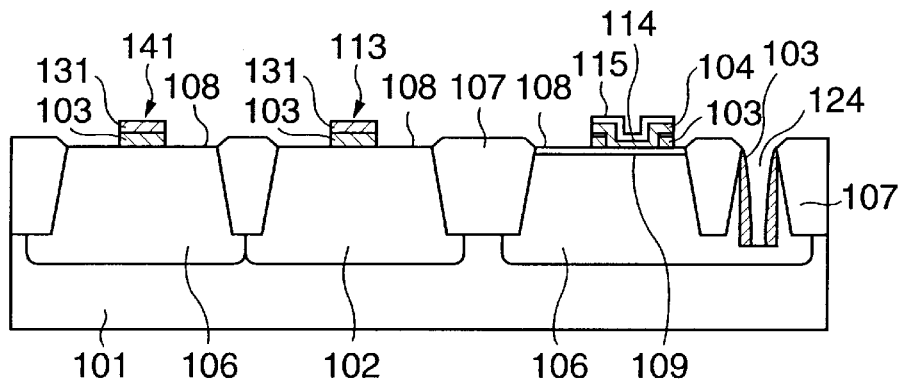

Then, in FIG. 2G, gate electrodes 113, 141 comprising the second polysilicon 103 and the fourth polysilicon 131 are formed by anisotropic etching by using a mask made of photoresist or the like. Thus, the gate electrodes 113, 141 of the CMOS device are constituted by a laminate of the first insulating film 108, second polysilicon 103, and fourth polysilicon 131 in order on the well regions 102, 106.

In this case, the second polysilicon 103 is left on the lower side of the emitter leading electrode 114 and the side wall of the collector trench 124.

Figure 2H:
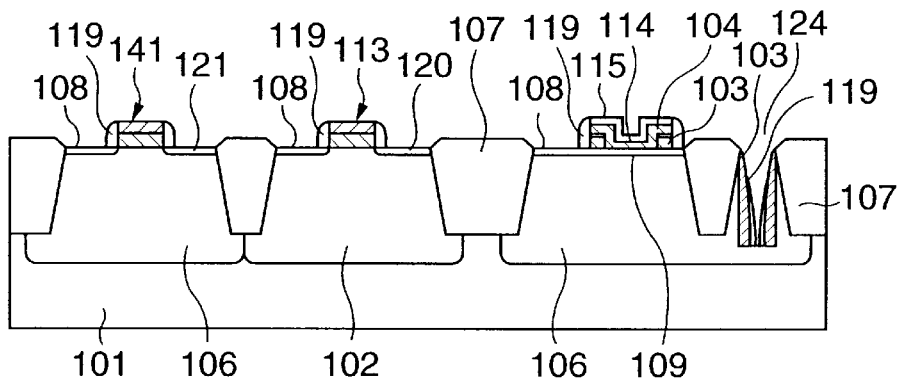

Then, in FIG. 2H, an N-type LDD layer 120 and a P-type LDD layer 121 are formed, an oxide film for a side wall is grown, and thereafter side walls of the gate electrodes 113, 141 and emitter leading electrode 114 are formed. A side wall 119 is formed on the second polysilicon 103 serving as the side wall of the collector trench 124 by anisotropic etching.

Figure 2I:
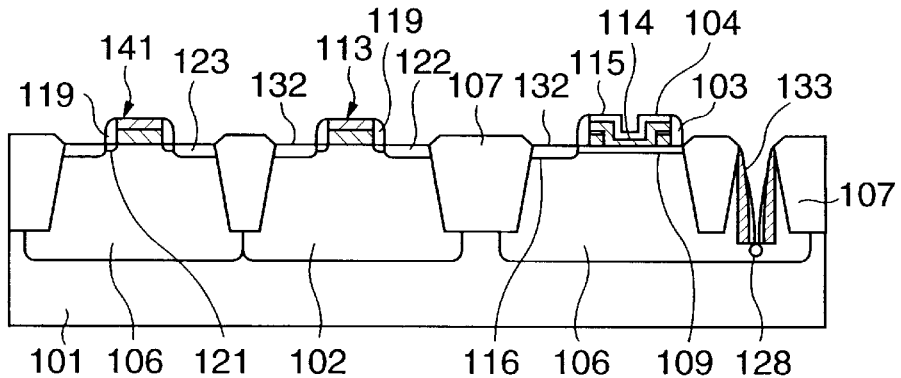

Then, in FIG. 2I, a thin oxide film 132 having a thickness of approximately 5 to 20 nm is formed on exposed surface of the device. Then N$^+$-type source-drain 122 of an NMOS is formed and an N$^+$-type diffusion layer 128 is formed at the bottom of the collector trench 124 by implanting ions of the impurity such as phosphorus or arsenic. This implantation of N-type ions also makes gate electrode 113 of the NMOS device into an N-type gate electrode. P$^+$-type source-drain 123 and a P$^+$-type graft base 116 of a PMOS are formed by implanting ions of the impurity such as boron. This implantation of P-type ions also makes gate electrode 141 of the PMOS device into a P-type gate electrode. An impurity is introduced into the emitter leading electrode 114 by implanting ions of the impurity such as phosphorus or arsenic when forming an N$^+$-type source-drain 122 of an NMOS or by introducing the impurity by adding another process step.

Figure 2J:
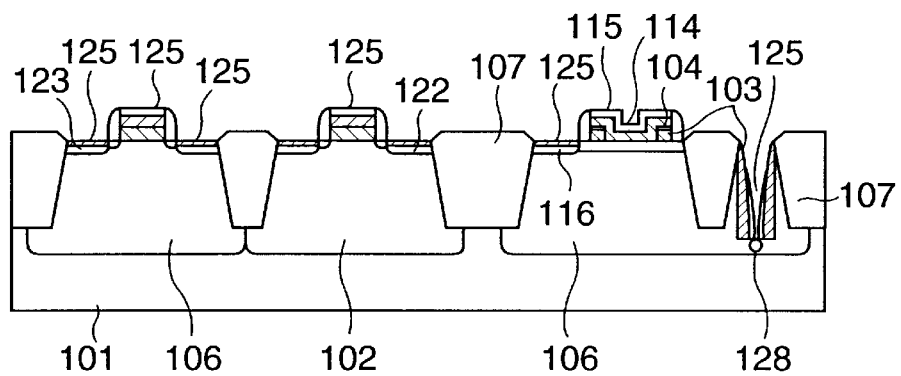

In FIG. 2J, surfaces of the gate electrode 113, 141, N$^+$-type diffusion layer 128 at the bottom of the collector trench 124, N$^+$-type source-drain 122, P$^+$-type source-drain 123, and P$^+$-type graft base 116 are transformed into silicide through a known method by using a metal such as titanium, cobalt, or nickel to form a silicide layer 125.

Figure 2K:
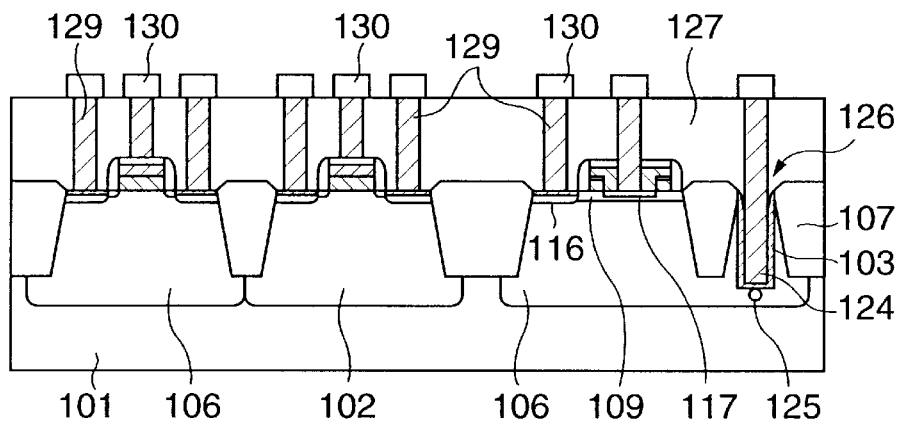

Then, in FIG. 2K, a layer insulating film 127 constituted of a 5 nm-thick oxide film (TEOS-SiO$_2$) and an 800 nm-thick BPSG (boron-phosphorus-silicate-glass) is grown. The film 127 may be subjected to RTA (rapid thermal annealing) at 1,050° C. for 5 to 15 sec or oven annealing at 900° C. for 20 to 30 min to form an emitter diffusion layer 117. A contact is opened to form a contact plug 129 through a barrier metal (not illustrated), and then metallic wiring 130 is formed.

In the above embodiment, the bipolar transistor is formed with the emitter region of the emitter leading electrode 114, the base region of the silicide layer 125 connected to the P-type base region 109 at the lower side of the emitter region, and the collector region of the N$^+$-type diffusion layer 128 at the bottom of the collector trench 124.

In the case of the first embodiment of the present invention, the third polysilicon 111 shown in FIG. 2D serving as part of the emitter leading electrode 114 is formed by implanting phosphorus or arsenic ions so that the peak concentration of the impurity in the third polysilicon 111 becomes $1 \times 10^{19}$ to $1 \times 10^{21}$ cm$^{-3}$. However, when the width of the emitter contact 110 is decreased, introduction of the impurity into the third polysilicon 111 by ion implantation makes it difficult to keep the concentration of the impurity in the third polysilicon 111 in the emitter contact 110 constant due to the plug effect. This causes an increase of emitter resistance and fluctuation of a current amplification factor.

Moreover, in the case of the first embodiment of the present invention, it is impossible to form the silicide layer 125 on the emitter leading electrode 114 because the surface of the emitter leading electrode 114 is covered with the third insulating film 115. Therefore, the resistance of the leading portion of an emitter leading electrode may increase compared to the case of the prior art.

The second embodiment of the present invention solves the above problems, which is described below with reference to FIGS. 3A–3H.

After completing the steps shown in FIGS. 2A–2C, and with reference to 3A, the first mask 105 is removed and fifth polysilicon 134 is formed with a thickness of 50 to 200 nm and containing an N-type impurity such as arsenic or phosphorus at a concentration of $1 \times 10^{19}$ to $1 \times 10^{21}$ cm$^{-3}$. The fifth polysilicon 134 is completely embedded at least in the emitter contact 110.

Figure 3A:
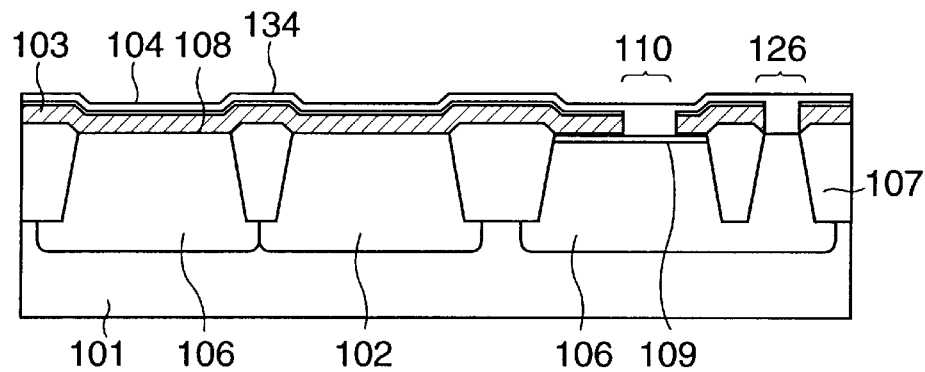
FIGS. 3A to 3H are sectional views for explaining the second embodiment of the present invention.
Figure 3B:
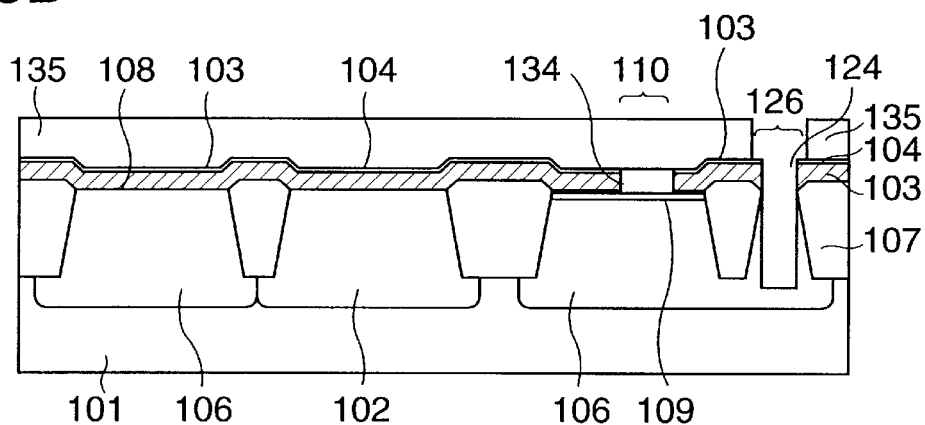

As shown in FIG. 3B, a collector trench 124 is formed by anisotropic etching by using a third mask 135 made of photoresist or the like. The bottom of collector trench 124 reaches a high impurity concentration collector region.

Figure 3C:
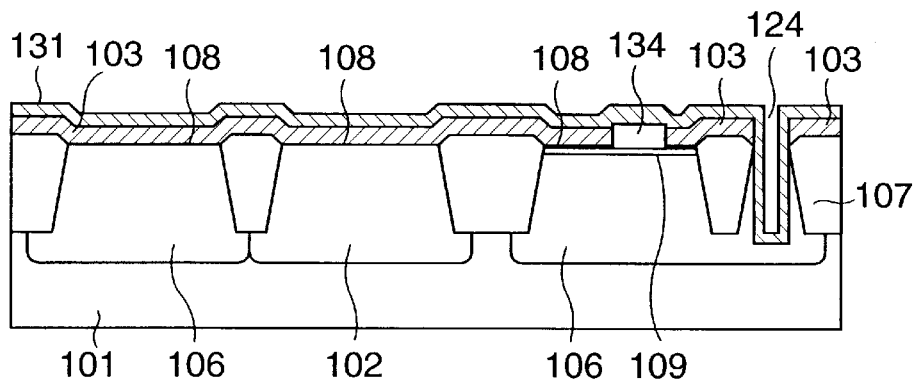

Then, in FIG. 3C, the third mask 135 is removed and fourth polysilicon 131 is formed with a thickness of 50 to 300 nm.

Figure 3D:
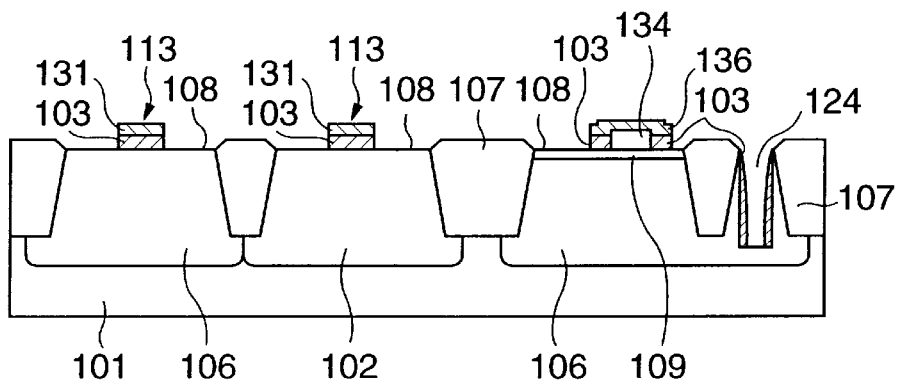

As shown in FIG. 3D, gate electrodes 113, 141 and the leading portion 136 of an emitter leading electrode are formed by anisotropic etching by using a mask made of photoresist or the like.

Figure 3E:
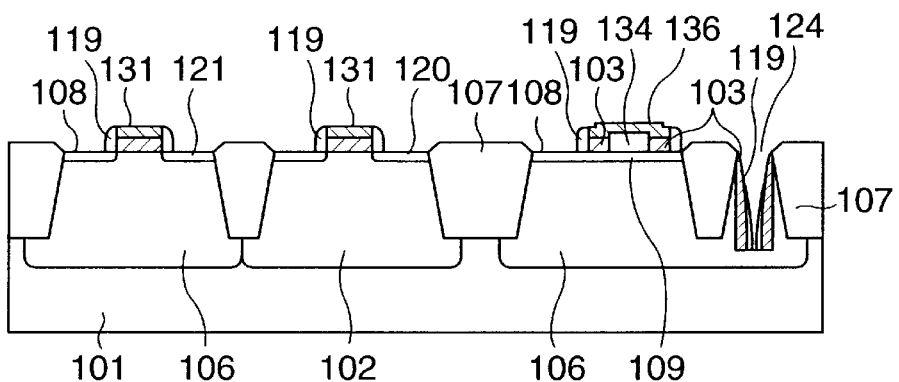

Then, in FIG. 3E, an N-type LDD layer 120 and a P-type LDD layer 121 are formed, a side wall oxide film is grown, and then a side wall 119 is formed on side walls of the gate electrodes 113, 141, emitter leading electrode 114, and collector trench 124 by anisotropic etching.

Figure 3F:
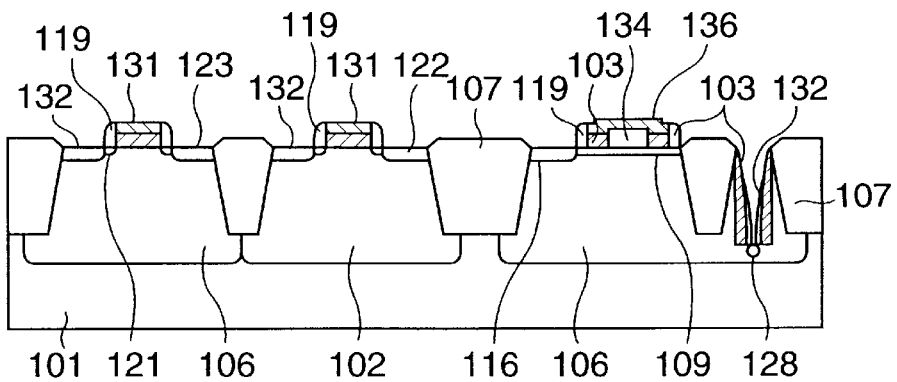

With reference to FIG. 3F, a thin oxide film 132 having a thickness of approx. 5 to 20 nm is formed, then an N$^+$-type diffusion layer 128 is formed on an N$^+$-type source-drain 122 of the NMOS device and at the bottom of the collector trench 124 by implanting ions of an impurity such as phosphorus or arsenic. This implantation of N-type ions also makes gate electrode 113 of the NMOS device into an N-type gate electrode. P$^+$-type source-drain 123 and a P$^+$-type graft base 116 of a PMOS are formed by implanting ions of an impurity such as boron or BF$_2$. This implantation of P-type ions also makes gate electrode 141 of the PMOS device into a P-type gate electrode. An impurity is introduced into the emitter leading electrode 136 by implanting ions of an impurity such as phosphorus or arsenic when forming the N$^+$-type source-drain 122 of an NMOS or by introducing an impurity such as phosphorus or arsenic in another process step.

Figure 3G:
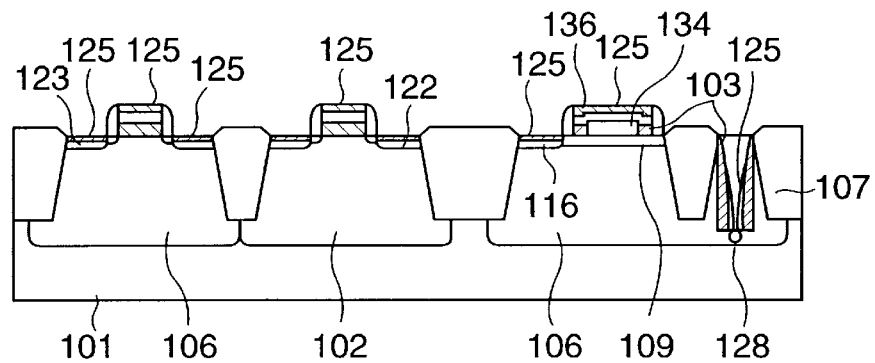

Then, in FIG. 3G, surfaces of the gate electrodes 113, 141, emitter leading electrode 136, N$^+$-type diffusion layer 128 at the bottom of the collector trench 124, N$^+$-type source-drain 122, P$^+$-type source-drain 123, and P$^+$-type graft base 116 are transformed into silicide by using a metal such as titanium, cobalt, or nickel to form a silicide layer 125.

Figure 3H:
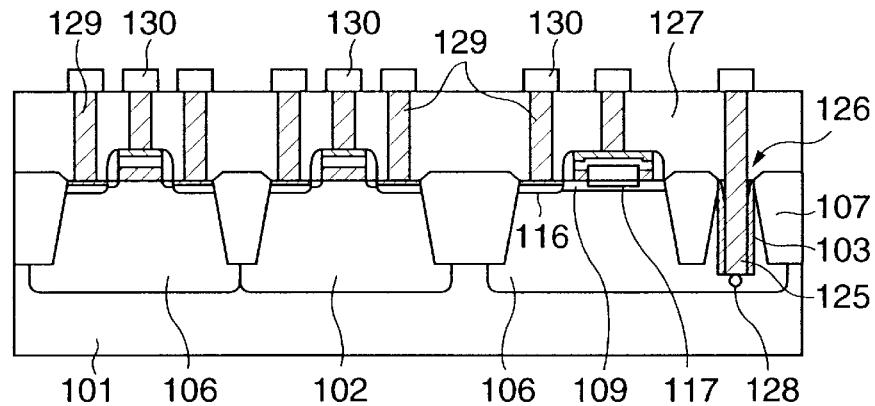

As shown in FIG. 3H, a layer insulating film 127 of 5 nm-thick oxide film (TEOS-SiO$_2$) and 800 nm-thick BPSG (boron-phosphorus-silicate-glass) is grown. The film may be subjected to RTA (rapid thermal annealing) at 1,050° C. for 5 to 15 sec or oven annealing at 900° C. for 20 to 30 min to form an emitter diffusion layer 117. Then a contact is opened to form a contact plug 129 through a barrier metal (not illustrated), and then metallic wiring 130 is formed.

As shown in FIG. 3D, the emitter leading electrode 134 includes the fifth polysilicon at the lower side of the leading portion 136 of the emitter leading electrode and polysilicon is used as the wiring portion of the electrode 134. However, when using a refractory metal such as tungsten or a silicide of a refractory metal such as tungsten silicide for the leading portion 136, it is possible to decrease the wiring resistance of the emitter leading electrode 136 and that of the gate electrodes 113, 141.

While preferred embodiments of the present invention have been described, it is to be understood that the invention is to be defined by the appended claims when read in light of the specification and when accorded their full range of equivalence.

What is claimed is:

1. A method of manufacturing a semiconductor device having a bipolar transistor and a MOS transistor comprising the steps of:

(a) forming a first insulation film on a semiconductor substrate, (b) forming a first conductive film on the first insulation film;

(c) opening the first insulation film and the first conductive film at an emitter region and a collector region of the bipolar transistor to form an emitter window and a collector window which reach the semiconductor substrate surface;

(d) forming a second conductive film different than the first conductive film covering the collector window and the emitter window;

(e) removing the second conductive film on the collector window without removing the second conductive film from the emitter window, and forming a collector trench in the semiconductor substrate through the collector window; and (f) forming a gate electrode of the MOS transistor by removing the first conductive film except at a gate region of the MOS transistor.

2. The method according to claim 1, wherein the collector trench is etched to a collector region of the substrate having a locally highest impurity concentration and further comprising the step of filling the collector trench with a contact plug.

3. The method according to claim 1, further comprising the step of covering the first conductive film with a second insulation film before step (c) is performed.

4. The method according to claim 1, further comprising the step of forming a third conductive film on the first conductive film after step (e) so that the gate electrode includes a laminated structure of the first conductive film and the third conductive film.

5. The method according to claim 4, wherein the third conductive film is formed on the second conductive film covering the emitter window, and wherein the second and third conductive films form an emitter leading electrode.

6. A method according to claim 4, wherein the first to the third conductive films comprise polysilicon.

7. The method according to claim 4, wherein the third conductive film is made of one of a refractory metal and a silicide of the refractory metal.

8. A method according to claim 1, further comprising the step of forming a third insulation film on the second conductive film, before step (e) and after step (d).

9. A method according to claim 1, wherein the step of removing the second conductive film in step (e) leaves a portion of the second conductive film which forms a part of an emitter leading electrode.

10. A method according to claim 1, wherein the first insulation film comprises a gate oxide film.

11. The method according to claim 1, wherein the first and second conductive films comprise polysilicon.

12. A method according to claim 1, wherein forming the second conductive film on the first conductive film in step (d) fills up the emitter window.

13. A method of manufacturing a semiconductor device having a bipolar transistor, a P-channel MOS transistor and an N-channel MOS transistor comprising the steps of:
 (a) forming a first insulation film on a semiconductor substrate,
 (b) forming a first conductive film on the first insulation film;
 (c) forming an emitter window and a collector window in a surface of the first conductive film;
 (d) forming a second conductive film different than the first conductive film covering the emitter window;
 (e) forming a collector trench in the semiconductor substrate through the collector window; and
 (f) forming a gate electrode of each of the P-channel MOS transistor and the N-channel MOS transistor by removing the first conductive layer except at gate regions of the P-channel MOS transistor and the N-channel MOS transistor.

14. The method according to claim 13, wherein the collector trench is etched to a collector region of the substrate having a locally highest impurity concentration and further comprising the step of filling the collector trench with a contact plug.

15. The method according to claim 13, further comprising the step of covering the first conductive film with a second insulation layer before step (c) is performed.

16. The method according to claim 13, further comprising the step of forming a third conductive film on the first conductive film after step (e) so that the gate electrode includes a laminated structure of the first conductive film and the third conductive film.

17. The method according to claim 16, wherein the third conductive film is made of one of a refractory metal and a silicide of the refractory metal.

18. A method according to claim 13, wherein the first insulation film comprises a gate oxide film.

19. The method according to claim 13, wherein the first and second conductive films comprises polysilicon.

20. A method according to claim 13, wherein forming the second conductive film on the first conductive film in step (d) fills up the emitter window.

* * * * *